United States Patent
Arena et al.

(10) Patent No.: US 9,178,091 B2
(45) Date of Patent: Nov. 3, 2015

(54) METHODS OF FABRICATING SEMICONDUCTOR STRUCTURES AND DEVICES USING QUANTUM DOT STRUCTURES AND RELATED STRUCTURES

(75) Inventors: Chantal Arena, Mesa, AZ (US); Heather McFelea, Tempe, AZ (US)

(73) Assignee: Soitec, Bernin (FR)

( * ) Notice: Subject to any disclaimer, the term of this patent is extended or adjusted under 35 U.S.C. 154(b) by 773 days.

(21) Appl. No.: 13/377,931

(22) PCT Filed: May 26, 2010

(86) PCT No.: PCT/US2010/036162
§ 371 (c)(1),
(2), (4) Date: Dec. 13, 2011

(87) PCT Pub. No.: WO2011/011111
PCT Pub. Date: Jan. 27, 2011

(65) Prior Publication Data
US 2012/0085400 A1    Apr. 12, 2012

Related U.S. Application Data

(60) Provisional application No. 61/227,006, filed on Jul. 20, 2009.

(51) Int. Cl.
*H01L 31/0368* (2006.01)
*H01L 31/04* (2014.01)
(Continued)

(52) U.S. Cl.
CPC ............ *H01L 31/04* (2013.01); *H01L 21/0237* (2013.01); *H01L 21/0254* (2013.01); *H01L 21/0262* (2013.01); *H01L 21/02458* (2013.01);
(Continued)

(58) Field of Classification Search
CPC .................................................. H01L 31/03048
USPC ........................................................... 136/258
See application file for complete search history.

(56) References Cited

U.S. PATENT DOCUMENTS 5,403,404 A    4/1995    Arya et al.
5,465,009 A *   11/1995    Drabik et al. ................. 257/723
(Continued)

FOREIGN PATENT DOCUMENTS

JP    2004095724 A    3/2004
JP    2010010678 A    1/2010
JP    2011523206 A    8/2011

OTHER PUBLICATIONS

Springer Handbook of Electronic and Photonic Materials, Section 32.7 Properties of Nitride Alloys, pp. 793-794 (2006).*

(Continued)

*Primary Examiner* — Jayne Mershon
(74) *Attorney, Agent, or Firm* — TraskBritt (57) ABSTRACT

Methods of fabricating photovoltaic devices include forming a plurality of subcells in a vertically stacked arrangement on a semiconductor material, each of the subcells being formed at a different temperature than an adjacent subcell such that the adjacent subcells have differing effective band-gaps. The methods of fabricating also include inverting the structure, attaching another substrate to a second semiconductor material, and removing the substrate. For example, each of the subcells may comprise a III-nitride material, and each subsequent subcell may include an indium content different than the adjacent subcell. Novel structures may be formed using such methods.

6 Claims, 7 Drawing Sheets (51) Int. Cl.
*H01L 31/18* (2006.01)
*H01L 21/02* (2006.01)
*H01L 31/0304* (2006.01)
*H01L 31/0352* (2006.01)

(52) U.S. Cl.
CPC .... *H01L 21/02507* (2013.01); *H01L 21/02513* (2013.01); *H01L 31/03048* (2013.01); *H01L 31/035218* (2013.01); *H01L 31/184* (2013.01); *H01L 31/1848* (2013.01); *H01L 31/1892* (2013.01); *Y02E 10/544* (2013.01)

(56) References Cited

U.S. PATENT DOCUMENTS

| | | | |
|---|---|---|---|
| 5,851,310 A | 12/1998 | Freundlich et al. | |
| 6,239,449 B1* | 5/2001 | Fafard et al. | 257/17 |
| 6,252,287 B1 | 6/2001 | Kurtz et al. | |
| 6,303,468 B1 | 10/2001 | Aspar et al. | |
| 6,335,258 B1 | 1/2002 | Aspar et al. | |
| 6,372,980 B1 | 4/2002 | Freundlich | |
| 6,756,286 B1 | 6/2004 | Moriceau et al. | |
| 6,809,044 B1 | 10/2004 | Aspar et al. | |
| 6,927,426 B2 | 8/2005 | Matsuoka et al. | |
| 6,946,365 B2 | 9/2005 | Aspar et al. | |
| RE39,484 E | 2/2007 | Bruel | |
| 7,306,823 B2 | 12/2007 | Sager et al. | |
| 2002/0162995 A1* | 11/2002 | Petroff et al. | 257/21 |
| 2005/0155641 A1* | 7/2005 | Fafard | 136/249 |
| 2007/0137698 A1 | 6/2007 | Wanlass et al. | |
| 2007/0151592 A1* | 7/2007 | Forrest et al. | 136/243 |
| 2008/0092945 A1* | 4/2008 | Munteanu et al. | 136/252 |
| 2008/0121271 A1 | 5/2008 | Raffaelle et al. | |
| 2008/0156366 A1 | 7/2008 | Kim et al. | |
| 2008/0178931 A1 | 7/2008 | Seo et al. | |
| 2008/0245400 A1 | 10/2008 | Li | |
| 2009/0072220 A1* | 3/2009 | Lee | 257/13 |
| 2009/0256165 A1* | 10/2009 | Smith et al. | 257/94 |
| 2009/0321781 A1 | 12/2009 | Broadley et al. | |
| 2010/0116333 A1* | 5/2010 | Ponce et al. | 136/256 |
| 2010/0311229 A1* | 12/2010 | Einav | 438/483 |
| 2011/0079767 A1 | 4/2011 | Senes et al. | |

OTHER PUBLICATIONS

Kononenko, Asymmetric Multiple-Quantum-Well Heterostructures Gand-Gap Engineering Concenption of Optoelectronic Elements with Widen Functionality, presented at ICTON, Th.C.6, pp. 163-167 (2002).*

Ponce et al., U.S. Appl. No. 61/113,323, pp. 1-17 (2008).*

International Preliminary Report on Patentability for International Application No. PCT/US2010/036162 dated Jan. 24, 2012, 6 pages.

Japanese Office Action for Japanese Application No. 2012-521637 mailed Jul. 30, 2010, 3 pages.

Japanese Final Office Action for Japanese Application No. 2012-521637 mailed Nov. 26, 2013, 4 pages.

Adelmann et al., "Growth and Optical Characterization of InGaN QDs Resulting from 2D 3D Transition," Phys. Stat. Sol. (a) 1996, vol. 176, pp. 639-642.

Choi et al., "Fabrication of InGaN Quantum Dots by Periodically Interrupted Growth in MOCVD," Proceedings of the SPIE, vol. 6831, pp. 683119-1-683119-8 (2008).

International Search Report for International Application No. PCT/US2010/036162 mailed Aug. 13, 2011, 3 pages.

International Written Opinion for International Application No. PCT/US2010/036162 mailed Aug. 13, 2011, 5 pages.

Park et al., Ultraviolet Light-Emitting Diodes with Self-Assembled InGaN Quantum Dots, Applied Physics Letters, vol. 90 (2007) pp. 111116-1-111116-3.

Tanaka et al., "Fabrication of Self Assembling GaN Quantum Dots on AlxGa1 xN Surfaces Using a Surfactant," App. Phys. Lett., vol. 69, pp. 4096-4098 (1996).

* cited by examiner

METHODS OF FABRICATING SEMICONDUCTOR STRUCTURES AND DEVICES USING QUANTUM DOT STRUCTURES AND RELATED STRUCTURES

CROSS-REFERENCE TO RELATED APPLICATIONS

This is a national phase entry under 35 U.S.C. §371 of International Patent Application PCT/US2010/036162, filed May 26, 2010, which claims the benefit under Article 8 of the Patent Cooperation Treaty to U.S. Provisional Patent Application Ser. No. 61/227,006, filed Jul. 20, 2009, for "Methods of Fabricating Semiconductor Structures and Devices Using Quantum DOT Structures and Related Structures," the entire disclosure of each of which is hereby incorporated herein by this reference.

TECHNICAL FIELD

The present invention relates generally to the fabrication of semiconductor structures or devices, such as photovoltaic devices, including quantum dot structures, and more particularly, to intermediate structures including a plurality of absorption structures having distinct effective band-gaps.

BACKGROUND

Solar energy is an abundant resource that may provide an alternative electrical energy source. However, solar energy can present problems to economically collect, store, and transport. One of the ways to collect and utilize solar energy is through photovoltaic (PV) cells, which convert solar energy directly into electrical energy. This conversion of energy can be provided utilizing i-type (intrinsic), n-type and p-type conductivity regions in semiconductor materials, thereby producing a photo-voltage potential and a photo-current generated when electron-hole pairs are formed in the semiconductor material. These electron-hole pairs are formed as a response to impinging photons in the photovoltaic cell.

The energy absorbed by a semiconductor is dependent on its characteristic band-gap. A semiconductor material's "band-gap energy" is defined as the amount of energy required to free an outer shell electron from its orbit about the nucleus to a free state. In semiconductors, the required energy for an electron to be excited from the valence band to the semiconductor conduction band differs based on the separation between the two bands (i.e., the band-gap). Different material may have different characteristic band-gap energies. Band-gap engineering is the process of controlling or altering the band-gap of a material. Conventional silicon based semiconductor materials used in photovoltaic cells (PVs) have a band-gap energy of about 1.1 eV, i.e., only covering a small portion of the broad range of solar radiation spectrum, which has a useable energy in the photon range of approximately 0.4 eV to 4.0 eV.

Light with energy below the band-gap of the semiconductor will not be absorbed and converted to electrical power. Light with energy above the band-gap will be absorbed, but electron-hole pairs that are created quickly lose their excess energy above the band-gap in the form of heat. Thus, this energy is not available for conversion to electrical power.

Therefore, in order to maximize the absorption and conversion of energy in a photovoltaic cell, multi-layered, multi-junction, or multi-subcell, photovoltaic devices have been developed. These multi-subcell devices utilize various materials having different characteristic band-gap energies so that a wider spectrum of solar energy may be absorbed.

A multi-subcell photovoltaic device conventionally includes multiple layers (i.e., subcells) of semiconductor material in a vertically stacked orientation. Each subcell is designed to absorb and convert a different solar energy or wavelength range than that of another subcell of different material. The subcell first exposed to radiant energy, generally has highest band-gap energy while subcells positioned below it have correspondingly smaller band-gap energies. As a result of this arrangement, energy that is not absorbed at one subcell (i.e., level) may be transmitted and converted in another subcell of the device enabling a broad spectrum of solar energy to be converted into electrical energy.

However, this type of multi junction photovoltaic device is limited by the ability to lattice match a number of dissimilar materials by heteroepitaxial growth. Lattice mismatching between adjacent subcells results in strain and dislocations to form, which reduces the overall efficiency of the photovoltaic device. Typically, materials that may be used in a photovoltaic device are severely limited due to the lattice mismatch problem. Attempts to overcome this problem and increase photovoltaic cell efficiency are described, for example, in U.S. Pat. No. 6,372,980 to Freundlich and U.S. Pat. No. 5,851,310 to Freundlich et al., which disclose photovoltaic cells including one or more quantum wells. In addition, U.S. Pat. No. 6,252,287 to Kurtz et al. discloses multi junction solar cells including an indium gallium arsenide nitride (InGaAsN)/gallium arsenide (GaAs) semiconductor p-n heterojunction to improve energy conversion.

Another area of interest in increasing the efficiency of PV cells relates to the use of quantum dots (QD). The band-gap energy of a quantum dot may be affected, not only by its composition, but also by varying its dimensions. Quantum dots have been incorporated into photovoltaic devices. For example, U.S. patent application Ser. No. 11/038,230, which was filed Jan. 21, 2005 by Fafard (U.S. Publication 2005/0155641 A1, published Jul. 21, 2005), discloses a photovoltaic solar cell including a plurality of subcells, at least one of which includes an epitaxially grown self-assembled quantum dot material. A germanium (Ge) bottom subcell is grown on a germanium substrate with a gallium arsenide middle subcell and a gallium indium phosphorus (GaInP) or aluminum gallium arsenic (AlGaAs) top subcell connected in series. The efficiency of the photovoltaic solar cell is improved by using the self-assembled quantum dot material in the middle subcell instead of bulk gallium arsenide material.

Photovoltaic devices utilize dissimilar materials to obtain the capability to absorb a broad spectrum of solar energies. However, the dissimilar materials create problems of lattice mismatch, which leads to poor crystal quality and limited solar cell efficiency. Accordingly, it would be an improvement in the art to provide a method of forming a photovoltaic device having a number of subcell elements capable of producing a photovoltage at multiple wavelengths of absorbed energy while maintaining a high quality crystal.

DISCLOSURE

In some embodiments, the present invention includes methods of forming semiconductor structures or devices. The methods may include depositing a layer of semiconductor material over a substrate, forming a subcell including at least one structure on the layer of semiconductor material and forming at least another subcell on a barrier material. The at least one structure may include a plurality of quantum dots at least partially surrounded by a barrier material. The at least another subcell may include another plurality of quantum dot structures surrounded with another barrier material. The another barrier material may have a substantially lower effective band-gap than the barrier material of the underlying subcell.

The present invention includes additional embodiments of methods of fabricating semiconductor structures or devices. Such methods may include depositing at least one layer of semiconductor material over a base substrate, fabricating at least one absorption structure on the at least one layer of semiconductor material to form a subcell and forming at least another absorption structure over the at least one absorption structure to form another subcell. The subcell may be formed by growing a plurality of quantum dots comprising indium gallium nitride on the at least one layer of semiconductor material and depositing a barrier material comprising indium gallium nitride over and at least partially surrounding the plurality of quantum dots at a first temperature while the another subcell may be formed by growing a plurality of quantum dots comprising indium gallium nitride on the barrier material of the at least one absorption structure and depositing another barrier material comprising indium gallium nitride over and at least partially surrounding the plurality of quantum dots at a second temperature, the second temperature being different from the first temperature.

In yet further embodiments, the present invention includes a photovoltaic structure that includes a plurality of subcells in a stacked arrangement overlying a first layer of semiconductor material on a substrate. Each of the plurality of subcells may have a lower effective band-gap than an adjacent subcell and may include at least one absorption structure. A second layer of semiconductor material may be disposed over an upper surface of the plurality of subcells and may comprise a material different from the first semiconductor material.

BRIEF DESCRIPTION OF THE DRAWINGS

While the specification concludes with claims particularly pointing out and distinctly claiming that which is regarded as the present invention, the advantages of this invention may be more readily ascertained from the description of the invention when read in conjunction with the accompanying drawings, in which:

DETAILED DESCRIPTION OF THE INVENTION

The illustrations presented herein are not meant to be actual views of any particular material, apparatus, system, or method, but are merely idealized representations that are employed to describe the present invention. Additionally, elements common between figures may retain the same numerical designation.

As used herein, the terms "upper" and "lower" refer to a location relative to a base or growth substrate. The term "upper" refers to a location that is distal to the substrate, while the term "lower" indicates proximity to the substrate.

As used herein, the term "effective band-gap" means and includes the lowest energy transitions at which photons may be absorbed by a material and is selected by the quantized energy levels of the heterostructure (i.e., the quantum dot structures and the barrier material).

As used herein, the term "absorption edge" means and includes a wavelength value at which the absorption shows a sudden decrease in value.

As used herein, the term "III type semiconductor material" means and includes any material predominantly comprised of one or more elements from group IIIA of the periodic table (B, Al, Ga, In, and Tl).

As used herein, the term "III-nitride material" means and includes any material substantially comprised of nitrogen and one or more elements from group III of the periodic table such as, for example, usually aluminum (Al), gallium (Ga) and/or indium (In).

As used herein, the term "III-V type semiconductor material" means and includes any material predominantly comprised of one or more elements from group IIIA of the periodic table (B, Al, Ga, In, and Tl) and one or more elements from group VA of the periodic table (N, P, As, Sb, and Bi).

As used herein, the term "dopant" or "doping agent" means and includes atoms added into a semiconductor lattice in order to increase the number of free charge carriers. Further, "n-type" dopants mean agents that act as electron donors and include atoms such as Ge, Si, O, etc., while "p-type" dopants mean agents that act as electron acceptors and include atoms such as Mg, Ca, Be, C, etc.

As used herein, the term "engineered substrate," in its broadest sense, means and includes any substrate comprising two or more layers of material and that is intended to be used as a substrate for the fabrication of one or more semiconductor devices thereon. Engineered substrates include, for example, semiconductor-on-insulator type substrates.

As used herein, the team "epitaxial layer of material" means a layer of material that is at least substantially a single crystal of the material and that has been formed, such that the single crystal exhibits a known crystallographic orientation.

As used herein, the term "lattice strain," when used with respect to a layer of material, means strain of the crystal lattice in directions at least substantially parallel to the plane of the layer of material.

It should be understood that a layer referred to as being "on" or "over" another layer or substrate may be disposed in direct contact with the layer or substrate, or alternatively, may be disposed on an intervening layer overlying the layer or substrate. It should also be understood that when a layer is referred to as being "on" or "over" another layer or substrate, it may cover the entire layer or substrate, or a portion of the layer or substrate.

Embodiments of the present invention include methods and structures that facilitate the fabrication of a solar cell or photovoltaic device that have selected degrees of effective band-gap energies such that a broad spectrum of solar energy may be absorbed and converted to electrical energy. Example embodiments of methods of fabricating photovoltaic devices that include such effective band-gap characteristics are described below with reference to FIGS. 1 through 12.

Embodiments of the invention may comprise non-inverted and inverted photovoltaic structures, wherein FIGS. 1-6 are directed toward embodiments related to non-inverted photovoltaic structures and FIGS. 6-12 are directed toward embodiments related to inverted photovoltaic structures. Heading are used herein for clarity only and without any intended limitation. A number of references are cited herein. Further, none of the cited references, regardless of how characterized above, is admitted as prior art relative to the invention of the subject matter claim herein.

Non-Inverted Photovoltiac Structures

Figure 1:
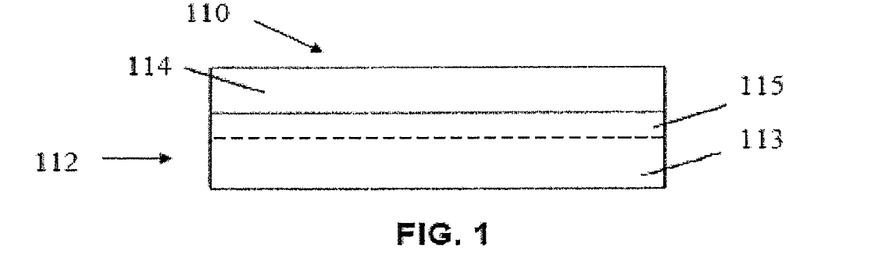
FIG. 1 is a simplified cross-sectional view of a partially formed structure that may be formed during embodiments of methods of the present invention and that includes at least one layer of semiconductor material overlying a growth substrate.

Referring to FIG. 1, a partially formed photovoltaic device structure 110 may be fabricated that includes a layer of semiconductor material 114 overlying a growth substrate 112. The layer of semiconductor material 114 comprises a seed layer for forming one or more additional layers of semiconductor material thereon as part of the fabrication of a photovoltaic device. In some embodiments, the layer of semiconductor material 114 may comprise a single epitaxial layer, or multiple epitaxial layers of a semiconductor material. Furthermore, in some embodiments, the layer of semiconductor material 114 may comprise a doped epitaxial layer of III-V type semiconductor material. By way of non-limiting example, the layer of semiconductor material 114 may comprise at least one of an epitaxial layer of gallium nitride (GaN) and an epitaxial layer of indium gallium nitride ($In_xGa_{1-x}N$). In some embodiments, the layer of semiconductor material 114 comprises an n-type material or a p-type material, such as silicon n-type doped gallium nitride or indium gallium nitride. As a non-limiting example, the layer of semiconductor material 114 may have an indium concentration greater than about twelve and one-half percent (12.5%).

The growth substrate 112 may comprise homogeneous or heterogeneous substrates suitable for growing III-nitride materials. As particular non-limiting examples, the growth substrate 112 may comprise aluminum oxide ($Al_2O_3$), which is often referred to as "sapphire," silicon carbide (SiC), gallium nitride (GaN), GaN on sapphire, indium gallium nitride (InGaN), InGaN on sapphire, quartz ($SiO_2$), gallium arsenide (GaAs), fused silica ($SiO_2$) glass, a glass-ceramic composite material (such as, for example, that sold by Schott North America, Inc. of Duryea, Pa. under the trademark ZERODUR®), or a fused silica glass composite material (such as, for example, $SiO_2$-$TiO_2$ or $Cu_2$-$Al_2O_3$-$SiO_2$).

With continuing reference to FIG. 1, the growth substrate 112 includes a base material 113 and, optionally, one or more intermediate layers of semiconductor material 115, depicted using a shadow line, that are ultimately disposed between the layer of semiconductor material 114 and the growth substrate 112. Such intermediate layers of material 115 may be used, for example, as a seed layer to reduce the level of compressive or tensile strain when it is difficult or impossible to form the layer of semiconductor material 114 directly on the base material 113 of the growth substrate 112. The figures are not shown to scale and, in actuality, the intermediate layer of semiconductor material 115 and the layer of semiconductor material 114 may be relatively thin in relation to a thickness of the base material 113 of the growth substrate 112.

By way of example and not limitation, the partially formed structure 110 may comprise a single intermediate layer of semiconductor material 115 formed on the base material 113 of the growth substrate 112, and the layer of semiconductor material 114 may be formed on the single intermediate layer of semiconductor material 115. The intermediate layer of semiconductor material 115 may include one or more layers of semiconductor material, such as, for example, a III-V type semiconductor material and may be formed to have a thickness sufficient for epitaxial growth of additional layers of semiconductor material thereon. In some embodiments, the layer of semiconductor material 114 may comprise an n-type or p-type doped semiconductor material. As a non-limiting example, the intermediate layer of semiconductor material 115 may comprise a tunnel junction structure, such as stacked layers of doped semiconductor material. Additionally, the intermediate layer of semiconductor material 115 may include a layer of an isolation material or a layer of a conductive material, examples of which are known in the art and are not described in detail herein. The intermediate layer of semiconductor material 115 may be grown using various methods known in the art such as, for example, hydride vapor phase epitaxy (HVPE), metal organic vapor phase epitaxy (MOVPE), and molecular beam epitaxy (MBE). Additionally, various methods may be used in forming the intermediate layer of semiconductor material 115 to reduce the density of dislocations therein, such as, for example, epitaxial lateral over-growth (ELO), facet-initiated epitaxial lateral over-growth (FIELO), in-situ masking, and wafer bonding.

To form the partially formed photovoltaic device structure 110 shown in FIG. 1, one or more intermediate layers of semiconductor material 115 may be epitaxially grown or otherwise formed on a major surface of the base material 113, after which the layer of semiconductor material 114 may be epitaxially grown or otherwise formed on the one or more intermediate layers of semiconductor material 115. In other embodiments, the layer of semiconductor material 114 may be epitaxially grown or otherwise formed directly on the base material 113 without including any intermediate layers of semiconductor material 115.

Figure 2:
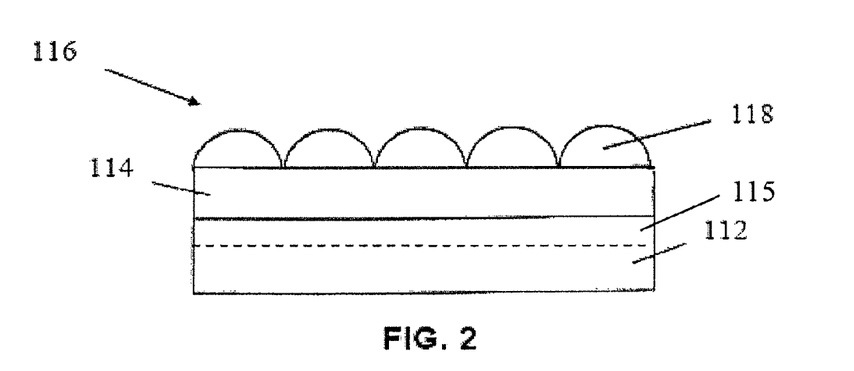
FIG. 2 is a simplified cross-sectional view of another partially formed structure that may be formed during embodiments of methods of the present invention and that includes a plurality of quantum dot structures on a layer of semiconductor material overlying a growth substrate.

Referring to FIG. 2, a plurality of quantum dot structures 118 may be formed on the doped semiconductor material 114 to form a partially formed photovoltaic device structure 116. The plurality of quantum dot structures 118 may comprise a III-nitride material such as, for example, indium gallium nitride ($In_xGa_{1-x}N$) or aluminum gallium nitride ($Al_xGa_{1-x}N$). Various methods known in the art may be used in forming the quantum dot structures 118. As a particular non-limiting example, the quantum dot structures 118 may be formed using a Stranski-Krastanow (S-K) growth mode, often referred to as "layer-plus-island growth," such as those described in detail in Adelmann et al., "Growth and Optical Characterization of InGaN QDs Resulting from 2D-3D Transition," Phys. Stat. Sol. (a), (176):639-642. Such a Stranski-Krastanow (S-K) growth mode may include forming a strained layer of GaN using, for example, a plasma-assisted molecule beam epitaxy (PA-MBE) process or an MBE process, or an MOCVD process, followed by reorganization (i.e., strain relaxation) in which three-dimensional structures are formed.

In additional embodiments, the quantum dot structures 118 may be formed using surfactants and anti-surfactants utilizing methods such as those described in detail in Tanaka et al., "Fabrication of Self-Assembling GaN Quantum Dots on $Al_xGa_{1-x}N$ Surfaces Using a Surfactant," App. Phys. Lett., 69:4096 (1996). Specifically, quantum dot structures 118 may be fabricated on a surface of a first layer of a III-nitride material, such as an indium gallium nitride ($In_xGa_{1-x}N$) layer, using a metal organic vapor phase epitaxy (MOVPE) process. To form self-assembling quantum dot structures 118, a second layer of a III-nitride material, such as a gallium nitride layer or indium gallium nitride ($In_xGa_{1-x}N$) with a dissimilar indium composition to the first layer, may be formed on the surface of the first layer of the III-nitride material and may be modified into a three-dimensional mode by using a "surfactant." Without wishing to be bound by any particular theory, it is believed that the surfactant inhibits the second layer of III-nitride material from wetting the surface of the first layer of III-nitride material due to the change in surface free energy.

In further embodiments, the quantum dot structures 118 may be formed using deposition of nanodroplets of type III-metals followed by nitridation of the nanodroplets, and selective growth methods. Additionally, the quantum dot structures 118 may be formed by annealing thin epitaxial layers of a III-nitride material, such as indium gallium nitride, in molecular nitrogen at a temperature of between about 400° C. to about 1000° C. The quantum dot structures 118 may also be formed using an interrupted growth mode, such as that disclosed in, for example, Choi et al., "Fabrication of InGaN Quantum Dots by Periodically Interrupted Growth in MOCVD," Proceedings of the SPIE, v. 6831, pp. 683119 (2008). The quantum dot structures 118 may be formed by a metal organic chemical vapor deposition (MOCVD) process using trimethyl-gallium (TMG), trimethyl-indium (TMI), and ammonia ($NH_3$) as precursors and $N_2$ and $H_2$ as carrier gases.

As is known in the art, the quantization energies and the effective band-gap energies of the quantum dot structures 118 may be controlled by varying the composition, dimensions, and configuration thereof. In some embodiments, the effective band-gap energy may be controlled by growing the quantum dot structures 118 to have an average diameter of less than 100 nm and an average height of less than 25 nm. As a non-limiting example, the initial growth temperature of the quantum dot structures 118 may be adjusted to control the shape and composition of the quantum dot structures 118. For example, the initial growth temperature of quantum dot structures 118 may be adjusted between about 400° C. to about 1000° C. In addition, the size and composition of quantum dot structures 118 may be controlled via the duration of the growth of quantum dot structures 118, for example, a growth duration of between about 15 seconds to about 120 seconds may be utilized. Additionally, the size and composition of the quantum dot structures 118 may be controlled by altering the partial pressure of precursor gases during formation. The quantum dot structures 118 formed on a surface of the layer of semiconductor material 114 or, if present, a surface of the intermediate layer of semiconductor material 115, may comprise substantially the same or similar dimensions. In other embodiments, the effective band-gap energy is controlled by altering, for example, the percent indium content of the dots 118. The quantum dot structures 118 may have band-gap energies ranging from about 0.7 eV to about 3.4 eV. As a non-limiting example, the quantum dot structures 118 may have an effective band-gap energy of about 1.0 eV.

Figure 3:
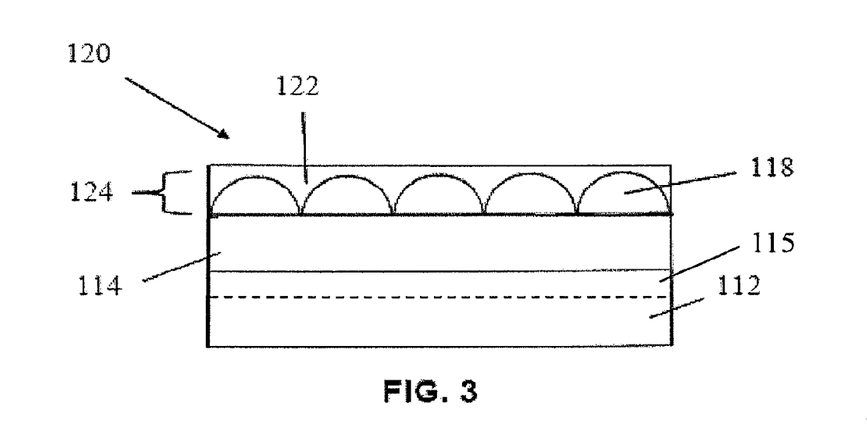
FIG. 3 is a simplified cross-sectional view of another partially formed structure that may be formed during embodiments of methods of the present invention and that includes an absorption structure comprising a barrier material encapsulating the plurality of quantum dot structures, as shown in FIG. 2.

Referring to FIG. 3, a barrier material 122 may be formed over the quantum dot structures 118 to form the partially formed photovoltaic device structure 120 including an absorption structure 124. As a non-limiting example, the barrier material 122 may be deposited to surround or encapsulate exposed surfaces of the quantum dot structures 118. The barrier material 122 may have a thickness sufficient to substantially cover a surface of each of the quantum dot structures 118 opposing a major surface of the layer of semiconductor material 114 or, if present, the intermediate layer of semiconductor material 115. As one particular non-limiting example, the barrier material 122 may have a thickness of less than about 50 nm and, more particularly, of between about 20 nm and about 40 nm.

The barrier material 122 may comprise a material having a substantially increased effective band-gap in comparison to the quantum dot structures 118. By way of example and not limitation, the barrier material 122 may comprise a III-nitride material such as, for example, aluminum gallium nitride ($Al_xGa_{1-x}N$), gallium nitride (GaN), indium gallium nitride ($In_xGa_{1-x}N$), and other binary and ternary III-nitrides. In some embodiments, the barrier material 122 may comprise a substantially decreased indium content in comparison to the quantum dot structures 118 so that the effective band-gap of the barrier material 122 is greater than the effective band-gap of the quantum dot structures 118 the barrier material 122 surrounds. Further, since the incorporation of indium into ternary indium gallium nitride is, at least in part, dependent upon the deposition temperature, a difference between a deposition temperature of the quantum dot structures 118 and a deposition temperature of the barrier material 122 may be less than about 200° C. The difference in deposition temperatures may be maintained to substantially prevent desorption of elements from the quantum dot structures 118. For example, it is known in the art that increasing the temperature of an indium gallium nitride material above a deposition temperature thereof may result in desorption therefrom. Further, desorption of indium from indium gallium nitride quantum dot structures may result in a change in the composition of the quantum dot structures and hence may change the effective band-gap of the quantum dot structures.

In other embodiments, the temperature during formation of the barrier material 122 can be varied during overgrowth of the quantum dot structures 118 to further control the size and composition of the quantum dot structures 118. For example, the variation of growth temperature during formation of barrier material 122 can result in, decreased desorption from quantum dot structure 118, controlled quantum dot structure dimensions and increased crystalline quality of barrier material 122.

As a non-limiting example, the variation of growth temperature during barrier material 122 formation may comprise an initial growth temperature for formation of a portion of the barrier material proximate to the quantum dot structures and a subsequent growth temperature for a remaining portion of the barrier material more distal from quantum dot structures 118. For example, an initial growth temperature for formation of a portion of the barrier material proximate to quantum dot structures 118 can be substantially equal to that utilized for the growth of the quantum dot structures. As the growth of the barrier material continues, the temperature of the growth can be increased, such an increase in growth temperature as the thickness of barrier material 122 increases can assist in improving the crystalline quality of barrier material 122.

In further embodiments of the invention, a portion of the barrier material may be grown at an initial growth temperature substantially equal to that used to form quantum dot structures 118, growth can then continue at the initial growth temperature until such time as the quantum dot structures are enclosed by barrier material 122. Upon enclosure of quantum dot structure 118 with barrier material 122, the growth temperature of the barrier material may be increased to improve the crystalline quality of the barrier material or growth can be paused upon enclosure of the quantum dot structures and the temperature of the reactor increased, in a gas ambient suitable for maintaining crystalline quality, for example, ammonia ($NH_3$) can be introduced to maintain the quality of III-nitride materials. Upon reaching the desired subsequent growth temperature, the remaining portion of barrier material 122 can be grown.

In still further embodiments, the characteristics of the quantum dot structures 118 may be modified by altering, for example, the partial pressure of precursor gases, the choice of substrate, and the growth rate. In this manner, the effective band-gap energy of the absorption structure 124 may be controlled.

Figure 4:
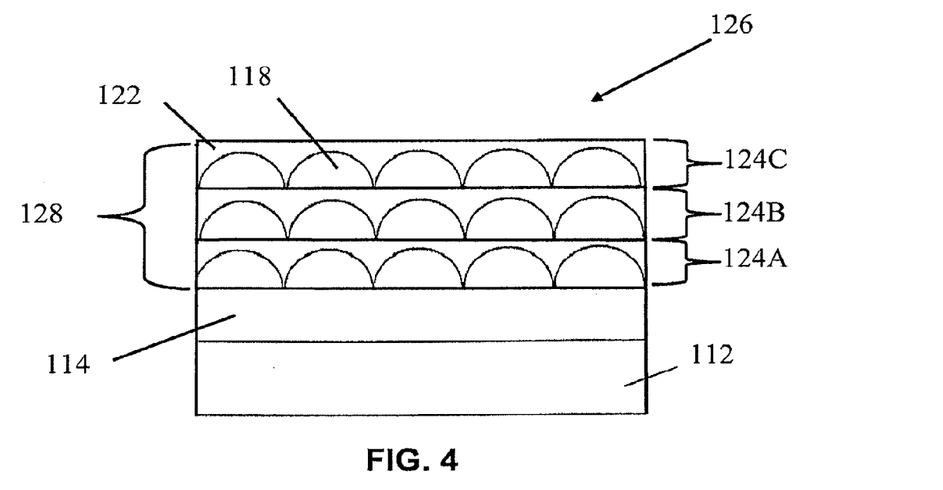
FIG. 4 is a simplified cross-sectional view of another partially formed structure that may be formed during embodiments of methods of the present invention and that includes a plurality of vertically stacked absorption structures forming a subcell overlying a growth substrate.

Referring to FIG. 4, a partially formed photovoltaic device structure 126 may be fabricated that includes a growth substrate 112 having a semiconductor material 114, optionally doped with p-type or n-type atoms, and having a first subcell 128 formed thereon. The first subcell 128 may comprise multiple absorption structures 124A, 124B, 124C disposed over one another in a stacked configuration over the semiconductor material 114. Within the first subcell 128, each absorption structure 124A, 124B, 124C may be fabricated using methods similar or identical to those described with respect to FIGS. 2 and 3. For example, the first absorption structure 124A may be formed by growing a layer of quantum dot structures 118 at an initial temperature, followed by deposition of a barrier material 122 around the quantum dots 118 at a different temperature, as described with respect to FIG. 3.

Following formation of the first absorption structure 124A, a plurality of absorption structures 124B, 124C may be fabricated on an upper surface of the barrier material 122 of the first absorption structure 124A to form a first subcell 128. The number of absorption structures within a subcell may be selected based on the electromagnetic radiation to be absorbed. For example, by increasing the thickness of each of the absorption structures 124A, 124B, 124C within the photovoltaic device structure 126 and increasing the number of absorption structures 124A, 124B, 124C, the probability of absorbing electromagnetic radiation may be increased. Therefore, the number of absorption structures 124A, 124B, 124C may be selected based on an absorption depth of incoming electromagnetic radiation. In some embodiments, the absorption structures 124A, 124B, 124C within a given subcell may have substantially the same configuration. As one non-limiting example, each of the quantum dot structures 118 of absorption structure 124A may have a general size and composition substantially identical to each of the quantum dot structures 118 of absorption structures 124B and 124C. Alternatively, each of the quantum dot structures 118 of the absorption structure 124A may have a substantially different size and composition in comparison to each of the quantum dot structures 118 of the absorption structures 124B, 124C.

With continued reference to FIG. 4, in some embodiments, the quantum dot structures 118 of the absorption structures 124A, 124B, 124C in the first subcell 128 may be in substantial alignment with one another. The alignment of the quantum dot structures 118 may be produced by the strain in the underlying absorption structure 124, which is present as a result of lattice mismatch between materials of the quantum dot structures 118 and the barrier material 122 using fabrication methods known in the art. Thus, by selectively tailoring the lattice parameter of the barrier material 122, lattice mismatch between the barrier material 122 and the quantum dot structures 118 forming part of the overlying absorption structures 124B, 124C may be utilized to promote alignment of subsequent quantum dot structures 118 in subsequent absorption structures 124B, 124C. As a result, embodiments of the present invention may allow the fabrication of quantum dot structures 118 in substantial alignment in each of the absorption structures 124A, 124B, 124C that may substantially increase the efficiency of the photovoltaic device structure 126.

The average dimensions of each of the quantum dot structures 118 may be selected to have a desired effective band-gap. The effective band-gap of each of the quantum dot structures 118 may be substantially increased by decreasing the average diameter thereof. For example, the average dimensions of the quantum dot structures 118 within the subcell 128 may be formed to have an absorption energy (i.e., an effective band-gap) of between about 0.7 eV and about 6.2 eV, and more particularly, from about 0.7 eV to about 4 eV. The effective band-gap of each of the quantum dot structures 118 may further be selected based on the number of subcells to be incorporated into the photovoltaic device, the ideal absorption energy and, therefore, the effective band-gap energy of the individual subcells may vary according to Table 1 below, which provides calculated efficiencies for photovoltaic structure comprising one or more subcells determined under idealized conditions. Such conditions are described in detail in, for example, U.S. Patent Application Publication No. 2007/0137698 to Wanlass et al.

TABLE 1

Optimum Band-gap Energy and Efficiencies for PVs

| Number of Subcells | Efficiency (%) | Effective Band-gap Energy (eV) | | | | | |
|---|---|---|---|---|---|---|---|
| 1 | 32.4 | 1.4 | | | | | |
| 2 | 44.3 | 1.0 | 1.8 | | | | |
| 3 | 50.3 | 1.0 | 1.6 | 2.2 | | | |
| 4 | 53.9 | 0.8 | 1.4 | 1.8 | 2.2 | | |
| 5 | 56.3 | 0.6 | 1.0 | 1.4 | 1.8 | 2.2 | |
| 6 | 58.5 | 0.6 | 1.0 | 1.4 | 1.8 | 2.0 | 2.2 |

Figure 5:
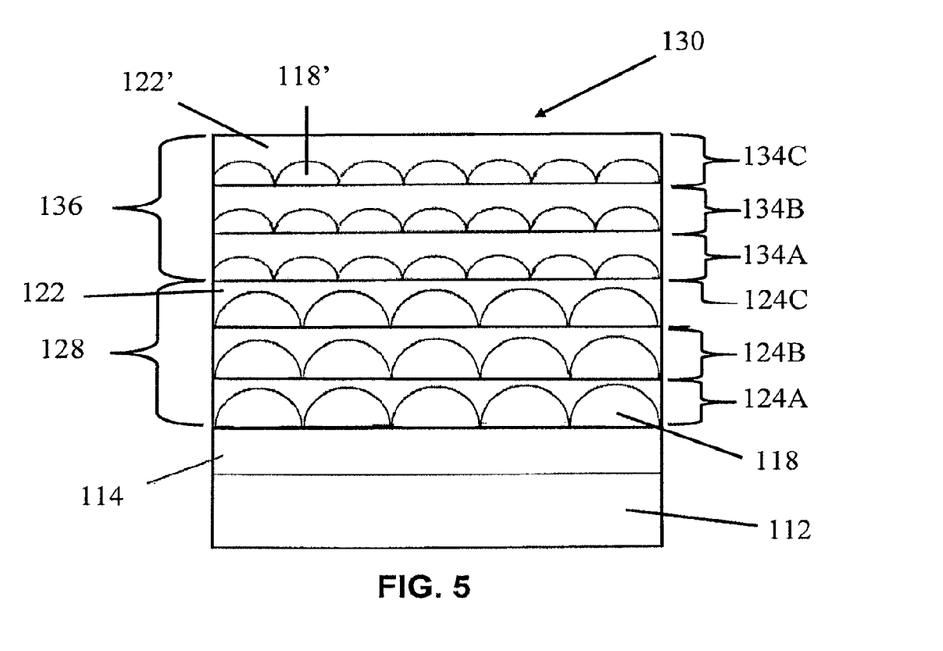
FIG. 5 is a simplified cross-sectional view of another partially formed structure that may be formed during embodiments of methods of the present invention and that includes a plurality of subcells overlying a growth substrate.

With reference to FIG. 5, another partially formed photovoltaic structure 130 is shown having a second subcell 136 formed over the barrier material 122 of the first subcell 128.

The subcell 136 may include, for example, a plurality of absorption structures 134A, 134B, and 134C, each of which includes a barrier material 122' overlying a plurality of quantum dots structures 118' and may be formed using methods similar or identical to those described with respect to FIGS. 2 and 3. In some embodiments, the quantum dot structures 118' in each of the absorption structures 134A, 134B, and 134C, may be formed having substantially the same average dimensions, to form the partially formed photovoltaic structure 130 shown in FIG. 5. In other embodiments, the quantum dot structures 118' in each of the absorption structures 134A, 134B, and 134C, may be formed having various average dimensions. The average dimensions of the quantum dot structures 118' may be selected to have a desired effective band-gap as described with respect to FIG. 4. As a non-limiting example, the quantum dot structures 118' may be formed such that an effective band-gap thereof is between about 0.7 eV and about 4 eV, or in certain embodiments, an effective band-gap of approximately 1.6 eV. The barrier material 122' may comprise a III-nitride material such as, for example, aluminum gallium nitride ($Al_xGa_{1-x}N$), gallium nitride (GaN), indium gallium nitride ($In_xGa_{1-x}N$), and other binary and ternary III-nitrides and may be formed using methods similar or identical to those described with respect to FIG. 3. The barrier material 122' may have an indium content substantially less than that of the barrier material 122 of the first subcell 128 and thus, an effective band-gap substantially greater than that of the barrier material 122. To form such a barrier material 122', the barrier material 122' of the second subcell 136 may be deposited at a temperature greater than a deposition temperature of the barrier material 122 of the first subcell 128. As previously discussed, the deposition temperature of the barrier material 122' the second subcell 136 may be maintained at about no greater than 200° C. above a deposition temperature of the barrier material 122 of the first subcell 128 to prevent desorption of indium from the quantum dot structures 118 and 118'.

Figure 6:
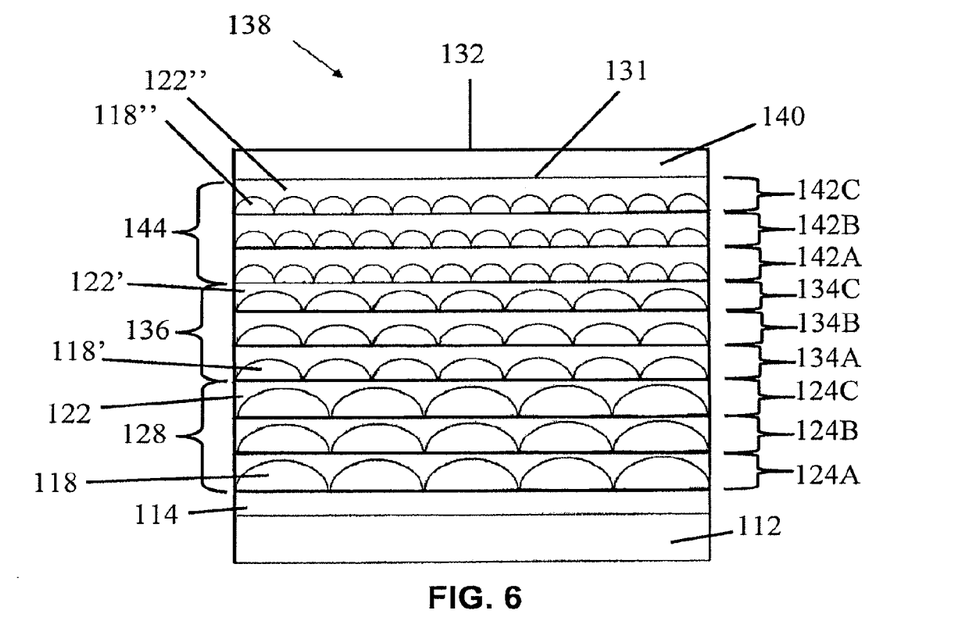
FIG. 6 is a simplified cross-sectional view of another partially formed structure that may be produced during embodiments of methods of the present invention and that includes another layer of semiconductor material overlying another plurality of subcells.

Referring to FIG. 6, a third subcell 144 may be formed over the second subcell 136 to form a partially formed photovoltaic device structure 138 having a plurality of subcells 128, 136, 144 overlying the growth substrate 112. The third subcell 144 may include a plurality of quantum dot structures 118" and a barrier material 122" formed over and at least partially surrounding each of the quantum dot structures 118". The quantum dot structures 118" of the third subcell 144 may be formed having average dimensions of substantially less than the average dimensions of the quantum dot structures 118' of the underlying subcell 136. The barrier material 122" may comprise a III-nitride material such as, for example, aluminum gallium nitride ($Al_xGa_{1-x}N$), gallium nitride (GaN), indium gallium nitride ($In_xGa_{1-x}N$), and other binary and ternary III-nitrides. The barrier material 122" of the third subcell 144 may be deposited at a temperature greater than a deposition temperature of the barrier material 122' of the second subcell 136 so that the barrier material 122" of the third subcell 144 has an indium content of substantially less than the indium content of the barrier material 122' of the second subcell 136.

In some embodiments, the average dimensions of each of the quantum dot structures 118 within each of the subcells 128, 136, 144 may be substantially identical or similar, such that each of the quantum dot structures 118 within one of the subcells 128, 136, 144 includes a substantially similar or identical effective band-gap. The average dimensions of each of the quantum dot structures 118 in subsequent subcells 136, 144 may be varied within each of the subcells 128, 136, 144. The effective band-gap energy of each of the quantum dots 118 within a selected one of the subcells 128, 136, 144 may be controlled by altering the average dimensions thereof, such that an absorption edge of the selected one of the subcells 128, 136, 144 corresponds to a desired portion of the electromagnetic spectrum. As a non-limiting example, the quantum dot structures 118 of the first subcell 128 may have an effective band-gap of about 1.0 eV, while the quantum dot structures 118' of the second subcell 136 may have a band-gap of about 1.6 eV, and the quantum dot structures 118" of the third subcell 144 may have a band-gap of about 2.2 eV.

Additionally, a composition of the barrier material 122 may be selected to maintain the effective band-gap between the quantum dot structures 118 while providing a barrier between subcells 128, 136, 144. By way of non-limiting example, if the barrier material 122 includes indium gallium nitride, an effective band-gap thereof may be substantially increased by decreasing an atomic percentage of indium therein. The incorporation of indium into the indium gallium nitride barrier material 122 may be substantially reduced by depositing the indium gallium nitride barrier material 122 at a substantially increased temperature, using methods known in the art. As each of the subcells 128, 136, 144 is formed, a deposition temperature thereof may be substantially increased in comparison to that of the previously formed subcells such that the indium concentration decreases and, thus, the absorption edge of adjacent subcells 128, 136, 144 sequentially increases.

As one such example, shown in FIG. 6, the dimensions of the quantum dot structures 118 in each subcell 128, 136, 144 may sequentially decrease in relation to an electromagnetic radiation source and thus, the effective band-gap of the subcell increases in relation to an electromagnetic radiation source. The corresponding barrier layers 122, 122', 122" of each of the subcells 128, 136, 144 may comprise indium gallium nitride and the effective band-gap thereof may be substantially sequentially increased by increasing the deposition temperatures as previously described. After forming a desired number of subcells 128, 136, 144, each having a different absorption edge, another layer of semiconductor material 140 may be deposited over an upper surface 131 of an uppermost subcell (e.g., subcell 144). The semiconductor material 140 may include, for example, a III-nitride material. In some embodiments, the layer of semiconductor material 140 may comprise an n-type or p-type doped III-nitride material. As a non-limiting example, the layer of semiconductor material 140 may include magnesium (Mg) doped gallium nitride or magnesium doped indium gallium nitride. By way of example and not limitation, the layer of semiconductor material 114 may comprise an n-type doped III-nitride material and the another layer of semiconductor material 140 may comprise a p-type doped III-nitride material, thereby producing a PIN photovoltaic diode device 138.

With continued reference to FIG. 6, in other embodiments, the band-gap energy of the subcells 128, 136, 144 may be controlled, while the average dimensions of the quantum dot structures 118, 118', 118" between subcells remain substantially similar or identical, by altering the composition of the quantum dot structures 118, 118', 118". In some embodiments, the indium content of the quantum dot structures 118 in each of the subcells 128, 136, 144 may substantially decrease as the subcell is located farther from the growth substrate 112 and closer to an incident electromagnetic source. By way of example and not limitation, the percentage indium content in the quantum dot structures 118, 118', 118" and the barrier material 122, 122', 122" may decrease toward the upper surface 132 of the photovoltaic device. Alternatively, the indium content in the barrier material 122 may remain constant, while the indium content in the quantum dot structures 118, 118', 118" decreases farther from the growth substrate 112 and closer to an incident electromagnetic source. By increasing deposition temperatures of the quantum dot structures 118, 118', 118" and the barrier layers 122, 122', 122" within each of the subcells 128, 136, 144, the indium content of each of the subcells 128, 136, 144 may be substantially less than that of the underlying subcell and, thus, the effective band-gap of each of the subcells 128, 136, 144 may be substantially greater than that of the underlying subcell.

Inverted Photovoltiac Structures

The following embodiments comprise structure and methods for producing inverted photovoltaic structures. By way of explanation and by no means limitation, in a photovoltaic device structure it is common for the absorption structure, i.e., the subcell, with the largest effective absorption energy (i.e., the largest effective band-gap) to be proximate to the impinging radiation source (e.g., solar radiation). In such a configuration, radiation that is not absorbed in the uppermost absorption structure may be transmitted through the structure and absorbed in an underlying absorption structure with a lower effective absorption energy (i.e., a lower effective band-gap). In such a configuration, a higher percentage of impinging radiation may be usefully converted to electrical energy. In an opposing configuration, i.e., when the smallest effective absorption energy is proximate to the impinging radiation, a higher percentage of impinging radiation may be wasted due to losses within the photovoltaic device structure, e.g., in the form of heat.

In order to more efficiently produce the desired absorption configuration in the completed photovoltaic device structure, it may be necessary to grow the crystalline absorption structures in a reverse manner, i.e., with the absorption structure with the smallest effective absorption energy most distal from the base substrate and the absorption structure with the highest effective absorption energy most proximal to the base substrate. Such a reversed growth configuration may be effective due to reasons of growth parameters or lattice matching the various absorption structures to each other and also to the base substrate.

Upon completion of the reversed crystal structure, an inversion of the structure may be required to produce a final device configuration favoring a more efficient conversion of incoming radiation to electrical energy. The inversion of the photovoltaic device structure can involve the attachment of the upper surface of the photovoltaic device structure to a carrier substrate. Following attachment to a suitable carrier substrate the initial base substrate can be removed thereby enabling the exposure of the photovoltaic device structure to impinging solar radiation.

Figure 7:
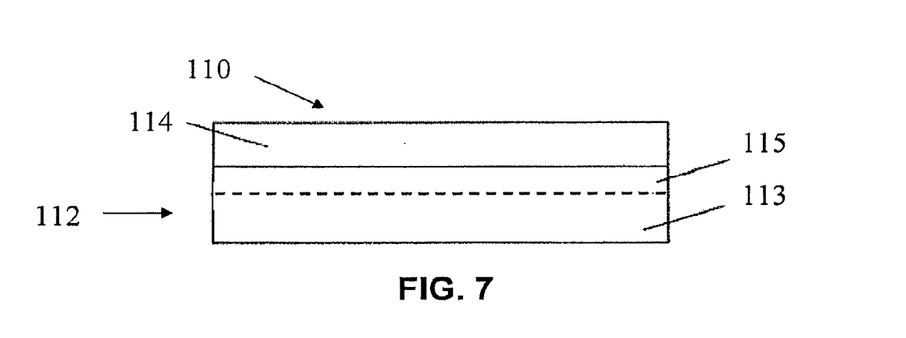
FIG. 7 is a simplified cross-sectional view of a partially formed structure that may be formed during embodiments of methods of the present invention and that includes at least a layer of semiconductor material overlying a growth substrate.

Referring to FIG. 7, a partially formed photovoltaic device structure 110 may be fabricated that includes a layer of semiconductor material 114 overlying a growth substrate 112 using methods similar or identical to those described with respect to FIG. 1. As a non-limiting example, the layer of semiconductor material 114 may comprise a p-type doped III-nitride material.

Figure 8:
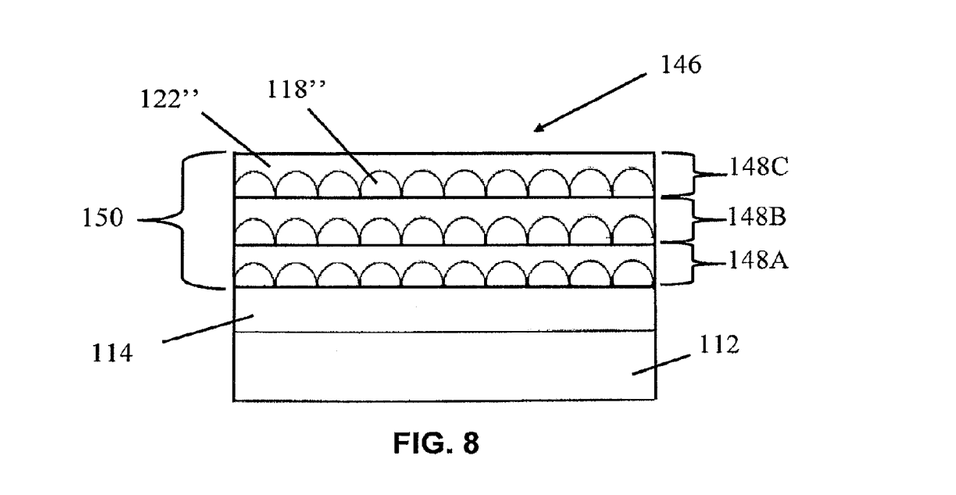
FIG. 8 is a simplified cross-sectional view of a partially formed structure that may be produced during embodiments of methods of the present invention and that includes a subcell including a plurality of absorption structures.

Referring to FIG. 8, another embodiment of a partially formed photovoltaic device structure 146 may be fabricated that includes a layer of semiconductor material 114 attached to a growth substrate 112 using methods substantially similar or identical to those described with respect to FIG. 1. The growth substrate 112 may comprise homogeneous or heterogeneous substrates suitable for the growth of type III-nitrides and the layer of semiconductor material 114 may comprise a single epitaxial layer, or multiple epitaxial layers of a semiconductor material, as previously described with respect to FIG. 1.

The growth substrate 112 may include a base material 113 (FIG. 1) and, optionally, one or more intermediate layers of semiconductor material 115 (FIG. 1), depicted using a shadow line, that are ultimately disposed between the layer of semiconductor material 114 and the base material 113.

Referring still to FIG. 8, partially formed photovoltaic device structure 146 may include a first subcell 150 comprising a plurality of absorption structures 148A, 148B, 148C having quantum dot structures 118" surrounded by barrier material 122". The subcell 150 may be fabricated using a method substantially similar or identical to those described with respect to FIGS. 2-4 above. By way of non-limiting example, the quantum dot structures 118" may comprise indium gallium nitride ($In_xGa_{1-x}N$). Subsequently, a barrier material 122" including a III-nitride material may be deposited, at a deposition temperature, over the quantum dot structures 118". The quantum dot structures 118" within each of the plurality of absorption structures 148A, 148B, 148C may comprise the same dimensions. Additionally, each of the absorption structures 148A, 148B, 148C may be formed having a desired effective band-gap by controlling the average dimensions and composition of the quantum dot structures 118" and barrier material 122" as discussed with respect to FIG. 4. For example, the quantum dot structures 118" may be formed to have an effective band-gap of 2.2 eV.

Figure 9:
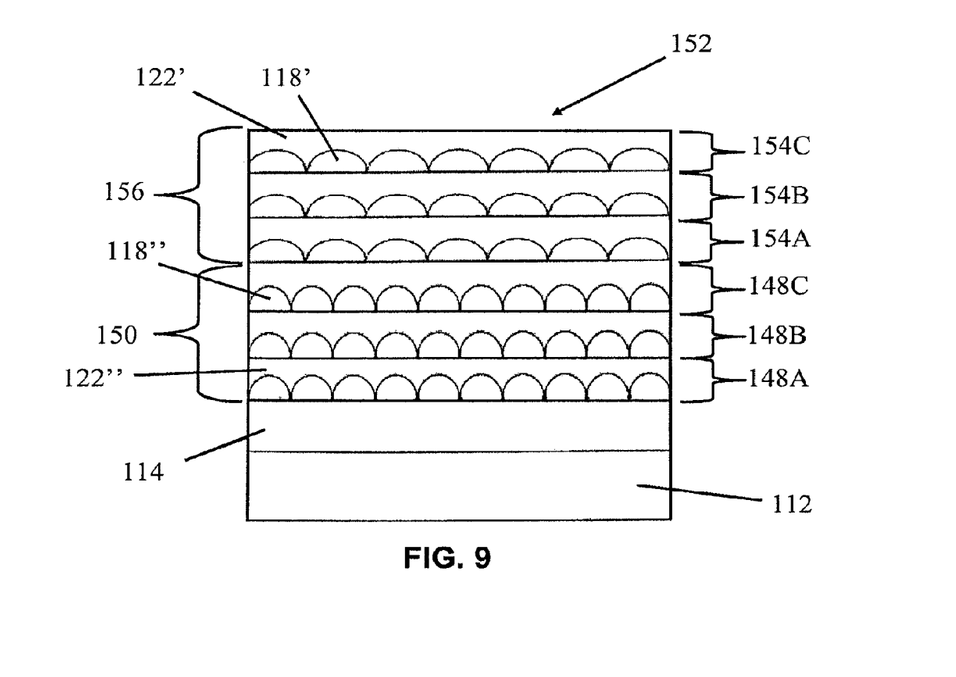
FIG. 9 is a simplified cross-sectional view of a partially formed structure that may be produced during embodiments of methods of the present invention and that includes a plurality of subcells, the subcell proximate the base substrate having the highest effective band-gap.

With reference to FIG. 9, a partially formed photovoltaic structure 152 including a plurality of subcells 150, 156 on the base substrate 112 is shown. The second subcell 156 may be formed over the first subcell 150 using a method substantially similar or identical to those described with respect to FIGS. 2-4 above. The second subcell 156 may include a plurality of absorption structures 154A, 154B, 154C, each having an absorption edge corresponding to a different portion of the electromagnetic spectrum than an absorption edge of the absorption structures 148A, 148B, 148C of the first subcell. By way of example and not limitation, the dimensions of the quantum dot structures 118" of a first subcell 150 may be substantially less than the dimensions of the quantum dot structures 118' of a second subcell 156. As a consequence of the increased size, the effective band-gap of the quantum dot structures 118' is substantially decreased. To form the quantum dot structures 118' having increased dimensions, the quantum dot structures 118' of the second subcell 156 may be formed at a lower temperature than a temperature at which the quantum dot structures 118" of the first subcell 150 are formed.

In additional embodiments, the effective band-gap of the subcells 150, 156 may be controlled, while maintaining the dimensions of the quantum dot structures 118", 118' between subcells, by altering a composition of the quantum dot structures 118'. As a non-limiting example, the quantum dot structures 118", 118' may have substantially similar or identical dimensions and may comprise indium gallium nitride throughout the subcells of the photovoltaic structure. The composition such as, for example, the indium content, of each of the quantum dot structures 118", 118' may be varied to provide a desired effective band-gap for each subcell.

The barrier material 122", 122' deposited over each of the plurality of quantum dot structures may be selected to maintain a desired difference between the effective band-gap of the quantum dot structures 118", 118' and the barrier material 122", 122'. Since the effective band-gap of the quantum dots structures 118", 118' has been substantially reduced by increasing the average dimensions of the quantum dots structures 118", 118', the effective band-gap of the barrier material 122", 122' may be decreased by increasing an indium content thereof. Therefore, the difference between the effective band-gap of the quantum dot structures 118", 118' and the barrier material 122", 122' may be maintained by depositing the barrier material 122", 122' at a substantially reduced temperature in comparison to a deposition temperature of underlying structures, such as the first subcell 150. By forming the barrier material 122' of the second subcell 156 at a reduced temperature, desorption of indium from the barrier material 122" of the first subcell 150 into the barrier material 122' of the second subcell 156 is substantially reduced or eliminated.

Figure 10:
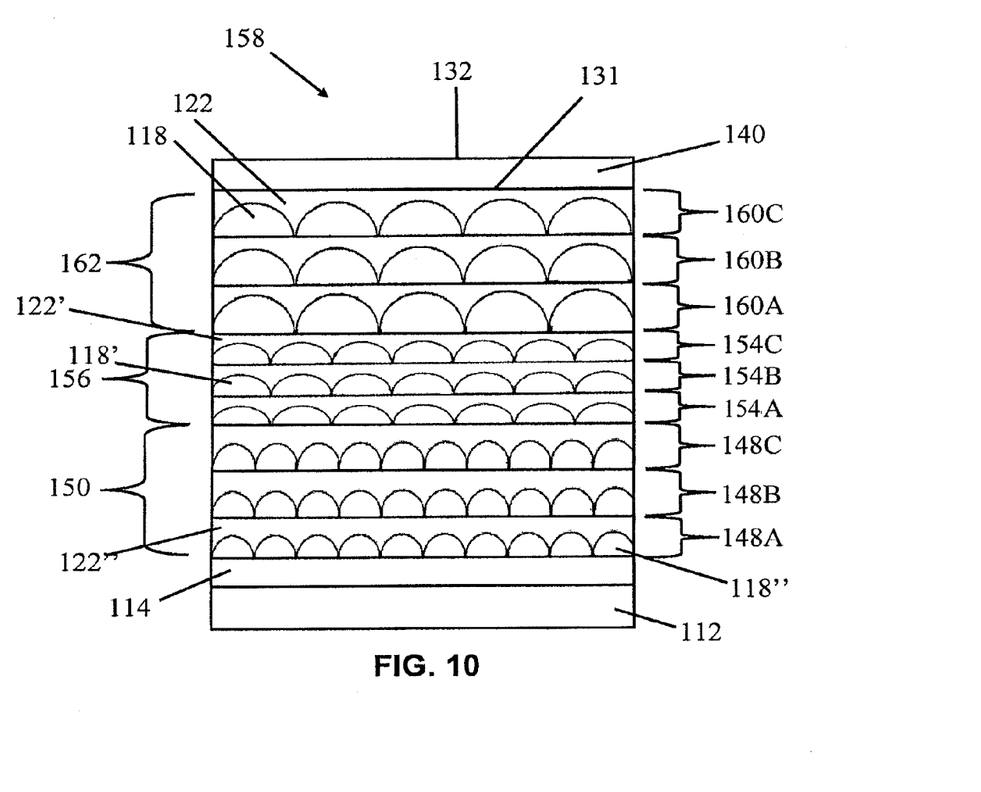
FIG. 10 is a simplified cross sectional view of a partially formed structure that may be produced during embodiments of methods of the present invention that includes a plurality of subcells overlying a layer of semiconductor material on a substrate and disposed below a second semiconductor material.

As shown in FIG. 10, a third subcell 162 may be formed over the second subcell 156 to form a partially formed photovoltaic structure 158. The third subcell 162 may include a plurality of absorption structures 160A, 160B, 160C, each of which includes a plurality of quantum dot structures 118 surrounded by a barrier material 122. The quantum dot structures 118 of the third subcell 162 may have substantially similar or identical average dimensions and may be formed to have an effective band-gap of less than that of the quantum dot structures 118", 118' of the first subcell 150 and the second subcell 156. For example, the quantum dot structures 118 of the third subcell 162 may have an effective band-gap of about 1.0 eV. As previously described, the dimensions of the quantum dot structures 118 may be selected such that each of the absorption structures 160A, 160B, 160C, includes an absorption edge corresponding to another portion of the electromagnetic spectrum. By way of non-limiting example, the absorption edge of the absorption structures 160A, 160B, 160C, of the third subcell may correspond to a different portion of the electromagnetic spectrum that those of the first subcell 150 and the second subcell 156. The barrier material 122 may be deposited over the quantum dot structures 118 of each absorption structure 156 using methods similar or identical to those described with respect to FIG. 3. An effective band-gap of the barrier material 122 of the third subcell 162 is substantially reduced by reducing a deposition temperature thereof to substantially increase incorporation of indium therein and to substantially reduce or eliminate desorption of indium from overlying materials (i.e., the barrier material 122" of the first subcell 150 and the barrier material 122' of the second subcell 156 and quantum dot structures 118" and 118).

The subcells 150, 156, 162 of the partially formed photovoltaic structure 158 have each been formed such that a deposition temperature used to form the individual subcells 150, 156, 162 is substantially decreased from subcell to subcell so each subcell includes an increased indium content in comparison to an underlying subcell. As a result, the effective band-gap energy for each subcell 150, 156, 162, as shown in FIG. 10, is highest in the lower subcell 150, nearest the base substrate 112, and is lowest in upper subcell 162, or farthest from the base substrate 112. In contrast, the indium content for each subcell 150, 156, 162, as shown in FIG. 10, is lowest in the lower subcell 150, nearest the base substrate 112, and is highest in upper subcell 162, or farthest from the base substrate 112.

The decreasing deposition temperature during subcell formation aids in the prevention of desorption of underlying subcells thereby improving the stability of the composition of the underlying material and hence the effective band-gap of the underlying absorption structures. The partially formed photovoltaic structure 158 may be inverted to operate as an effective solar device.

Referring still to FIG. 10, another layer of semiconductor material 140 may be deposited on the upper subcell (i.e., the third subcell 162) of the partially formed photovoltaic structure 158. By way of example and not limitation, the layer of semiconductor material 114 may comprise a p-type doped semiconductor material and the another layer of semiconductor material 140 may comprise an n-type doped semiconductor material.

Each subcell 150, 156, 162, and associated absorption structures 148A-C, 154A-C, 160A-C, may be formed to absorb a specific portion of the electromagnetic spectrum depending on the number of subcells to be incorporated into the photovoltaic device. Accordingly, an ideal absorption energy, and therefore an effective band-gap, of the individual subcells may vary. As one non-limiting example, the effective band-gap of each of the subcells 150, 156, 162 may be controlled by altering the dimensions of the quantum dots structures 118", 118', 118 in each subcell. In some embodiments, the dimensions of the quantum dot structures 118", 118', 118 are varied from subcell-to-subcell while the dimensions are maintained within individual subcells 150, 156, 162. As one such example, shown in FIG. 10, the size of the quantum dot structures 118", 118', 118 in each of the subcells 150, 156, 162 may sequentially increase in relation to the subcell's proximity to an electromagnetic radiation source. In other embodiments, the physical size of the quantum dot structures 118", 118', 118 in each of the plurality of subcells 150, 156, 162 may remain constant and a composition of the quantum dot structures 118", 118', 118 may be varied to render a desired effective band-gap. For simplicity, the partially formed photovoltaic structure 158 is shown including three subcells, each including three absorption structures. However, the partially formed photovoltaic structure 158 may be formed to include any number of subcells, each including any number of absorption structures, using the methods described herein.

Figure 11:
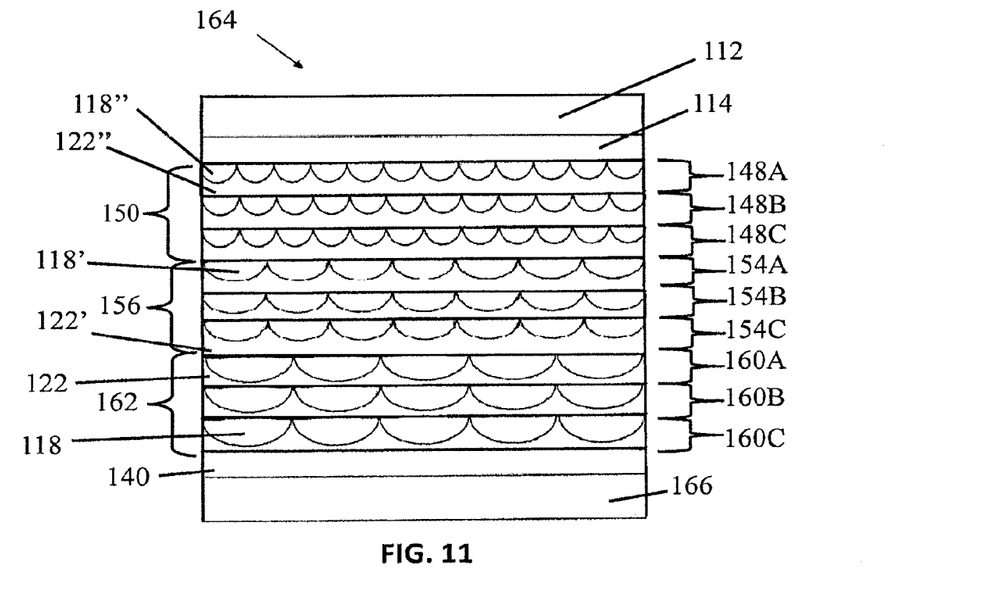
FIG. 11 illustrates attachment of a bonding substrate to the partially formed structure of FIG. 10, the bonding substrate is attached to the second semiconductor material on an inverted structure.
Figure 12:
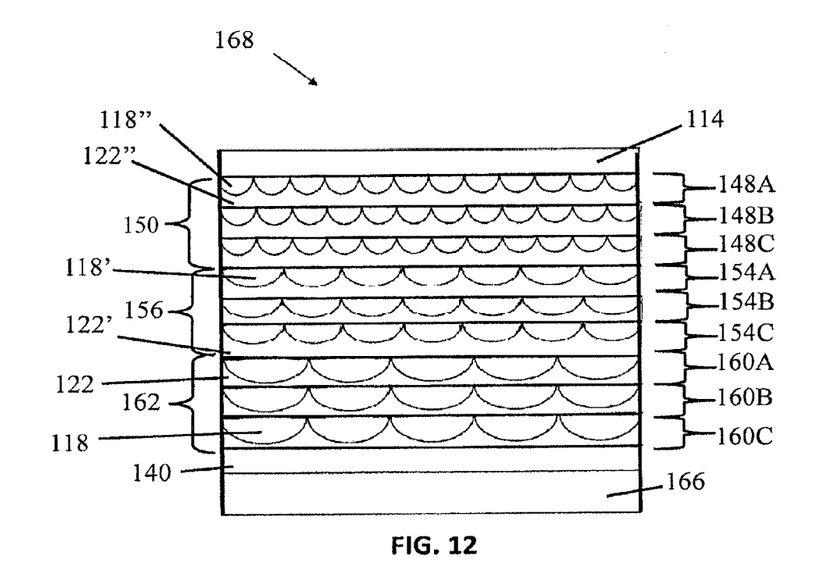
FIG. 12 is a simplified cross sectional view of a photovoltaic device, formed as illustrated in FIGS. 8-11, following delamination of the base substrate from the first semiconductor material.

With reference to FIG. 11, the partially formed photovoltaic structure 164 is shown including a bonding substrate 166 attached to semiconductor material 140 of the structure depicted in FIG. 10. To fabricate the intermediate photovoltaic device 164, the structure of FIG. 10 is inverted and attached to bonding substrate 166 using methods known in the art. As a result, the band-gap energies are also inverted, placing the highest effective band-gap energy subcell proximate to the incoming electromagnetic radiation. However, the base substrate 112 may prevent absorption of incoming solar radiation by the subcells. In some embodiments, the base substrate 112 is removed from the intermediate structure 164, thereby forming a photovoltaic device 168, as shown in FIG. 12, capable of transferring solar radiation into electrical energy. The base substrate 112 may be removed by known methods such as ion implantation, etching, lift off, grinding, and laser lift off. As one such non-limiting example, the base substrate 112 may be separated according to the SMART-CUT™ process described in detail in, for example, U.S. Pat. No. RE39,484 to Bruel, U.S. Pat. No. 6,303,468 to Aspar et al., U.S. Pat. No. 6,335,258 to Aspar et al., U.S. Pat. No. 6,756,286 to Moriceau et al., U.S. Pat. No. 6,809,044 to Aspar et al., and U.S. Pat. No. 6,946,365 to Aspar et al.

For example, using embodiments of methods of the present invention described above, an absorption structure may be formed to include a plurality of indium nitride quantum dot structures surrounded by a gallium nitride barrier material. A gallium nitride (GaN) material may be formed on a sapphire substrate by exposing the sapphire substrate to, for example, ammonia and trimethylgallium, at a temperature of about 1170° C. using a metal organic chemical vapor deposition (MOCVD) process. Following growth of the GaN material, indium nitride (InN) quantum dot structures may be provided thereon. The quantum dot structures may be grown by exposing the gallium nitride to trimethylindium and ammonia at a temperature of about 520° C. for about 10 seconds to 60 seconds. The quantum dots may have a density of about $1 \times 10^{12}$ cm$^{-2}$, a mean height of about 10 nm and a mean width of about 10 nm.

After formation of the InN quantum dots a barrier material of GaN may be deposited over the quantum dots. The GaN, in this example, may be deposited at the same temperature as the quantum dots using a trimethylgallium precursor. Alternatively, triethylgallium may also be used as a precursor to the barrier material. As described herein, multiple subcells may be fabricated according to the principles above.

Although embodiments of the present invention have been primarily described herein with reference to layers of semiconductor material 114, 140 comprising indium gallium nitride, the present invention is not so limited, and embodiments of the present invention may be used to provide layers of semiconductor material comprising other III-nitride materials, layers of other III-V type semiconductor materials, or layers of other semiconductor materials (such as, for example, layers of II-VI type semiconductor materials, layers of silicon, and layers of germanium). Additionally, although the embodiments of the present invention have been primarily depicted herein with three subcells, the present invention is not so limited and embodiments of the present invention may include more or less subcells.

While the present invention has been described herein with respect to certain preferred embodiments, those of ordinary skill in the art will recognize and appreciate that it is not so limited. Rather, many additions, deletions and modifications to the preferred embodiments may be made without departing from the scope of the invention as hereinafter claimed. In addition, features from one embodiment may be combined with features of another embodiment while still being encompassed within the scope of the invention as contemplated by the inventors.

What is claimed is:

1. A method of forming a photovoltaic device, comprising:
   forming a semiconductor structure or device, comprising:
      depositing at least one layer of semiconductor material over a base substrate;
      forming a subcell comprising one or more absorbance structures, wherein forming each of the one or more absorbance structures comprises:
         disposing a plurality of quantum dots comprising indium gallium nitride to overlie at least a portion of the at least one layer of semiconductor material; and
         depositing a barrier material comprising indium gallium nitride at a first temperature, the barrier material overlying and at least partially surrounding at least a portion of the plurality of quantum dots; and
      after forming the subcell, forming at least another subcell over the subcell, the at least another subcell comprising one or more absorbance structures, wherein forming each of the one or more absorbance structures comprises:
         disposing a plurality of quantum dots comprising indium gallium nitride to overlie at least a portion of the barrier material; and
         depositing another barrier material comprising indium gallium nitride at a second temperature, the second temperature being less than the first temperature used to deposit the barrier material such that the at least another subcell has a substantially higher indium content than an underlying subcell, the another barrier material overlying and at least partially surrounding at least a portion of the plurality of quantum dots;
   inverting the semiconductor structure or device;
   bonding a carrier substrate to the semiconductor structure or device, wherein the carrier substrate is bonded to a surface of the semiconductor structure or device proximate to the another subcell; and
   removing the base substrate.

2. The method of claim 1, wherein depositing the barrier material comprising indium gallium nitride over and at least partially surrounding the plurality of quantum dots comprises depositing the barrier material such that the barrier material has a substantially lower indium content than an indium content of the plurality of quantum dots.

3. The method of claim 2, wherein depositing the barrier material having a substantially lower indium content than an indium content of the plurality of quantum dots comprises depositing the barrier material at a temperature of greater than a growth temperature of the plurality of quantum dots.

4. The method of claim 1, wherein forming at least another subcell comprising one or more absorbance structures comprises forming at least another absorbance structure having a substantially lower effective band-gap than the underlying subcell.

5. The method of claim 1, wherein disposing a plurality of quantum dots comprising indium gallium nitride to overlie at least a portion of the barrier material comprises growing the plurality of quantum dots on an intermediate layer disposed on the barrier material.

6. The method of claim 1, wherein disposing a plurality of quantum dots comprising indium gallium nitride to overlie at least a portion of the barrier material comprises growing the plurality of quantum dots directly on the barrier material.

* * * * *